United States Patent [19]
Bergman et al.

[11] Patent Number: 5,661,644
[45] Date of Patent: Aug. 26, 1997

[54] CONVERTER CIRCUIT, CIRCUITRY HAVING AT LEAST ONE SWITCHING DEVICE AND CIRCUIT MODULE

[75] Inventors: Karl Bergman, Västerås; Bo Bijlenga, Skultuna; Willy Hermansson; Lennart Zdansky, both of Västerås, all of Sweden

[73] Assignee: ABB Research Ltd., Zurich, Switzerland

[21] Appl. No.: 511,118

[22] Filed: Aug. 4, 1995

[30] Foreign Application Priority Data

Jun. 21, 1995 [SE] Sweden ................. 9502249

[51] Int. Cl.[6] ............... H02H 7/122; H01L 31/0312
[52] U.S. Cl. ........................................ 363/56; 257/77
[58] Field of Search ................ 363/50, 56; 257/77

[56] References Cited

U.S. PATENT DOCUMENTS

| 3,745,505 | 7/1973 | Turnbull et al. | 338/20 |
|---|---|---|---|
| 3,767,980 | 10/1973 | Kamath | 317/235 R |
| 4,303,877 | 12/1981 | Meinhold | 320/6 |
| 5,008,735 | 4/1991 | Edmond et al. | 257/77 |

FOREIGN PATENT DOCUMENTS 0 533 158 of 1993 European Pat. Off. .
06268202 of 1994 Japan .
WO 90/07192 of 1990 WIPO .

OTHER PUBLICATIONS

Thorborg, Power Electronics — In Theory and Practice, Studentlitteratur, Chartwell–Bratt, pp. 57–61.
Skuldelny et al., Comparative Study of high Power Devices in Converter Circuits, Power Semiconductor Devices and Circuits, ed by A A Jaecklin, pp. 197–238, Plenum Press, New York 1992.
Bayerer et al., IGBT–Halbbrucken mit Ultraschnellen Dioden, etz. Bd. 108, Heft 19, 1987, pp. 922–924.
Fullman et al., A New Fast Power Diode, PCIM Europe, Sep./Oct. 1992, pp. 191–195.
Junge et al., Verbesserung des Dynamischen Verhaltens von Rucklaufdioden in Pulswechseltichtern, etz Bd, 110, Heft 10, 1989, pp. 478–483.
Mori et al., A Novel Soft and Fast Recovery Diode (SFD) with Thin P–layer Formed by Al–Si Electrode, Proceedings of ISPSD '90, 1990, pp. 113–117.
Butcher, Ultrafast Recovery Diodes, PCIM Europe, Jan./Feb. 1993, pp. 22–24.

*Primary Examiner*—Stuart N. Hecker
*Attorney, Agent, or Firm*—Pollock, Vande Sande & Priddy

[57] ABSTRACT

A converter circuit has at least one switching device and a SiC diode arranged to be conducting when the device is turned off and reverse-biased when the device is turned on.

21 Claims, 2 Drawing Sheets

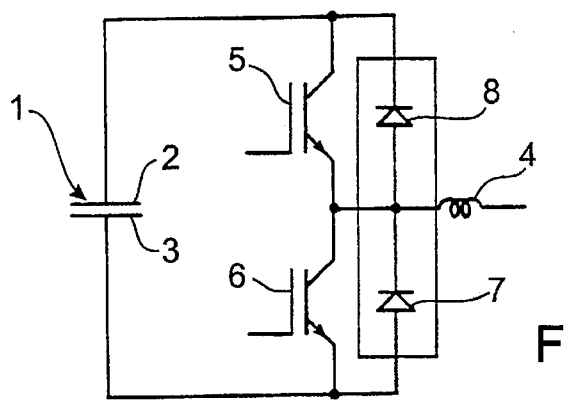
Fig. 1
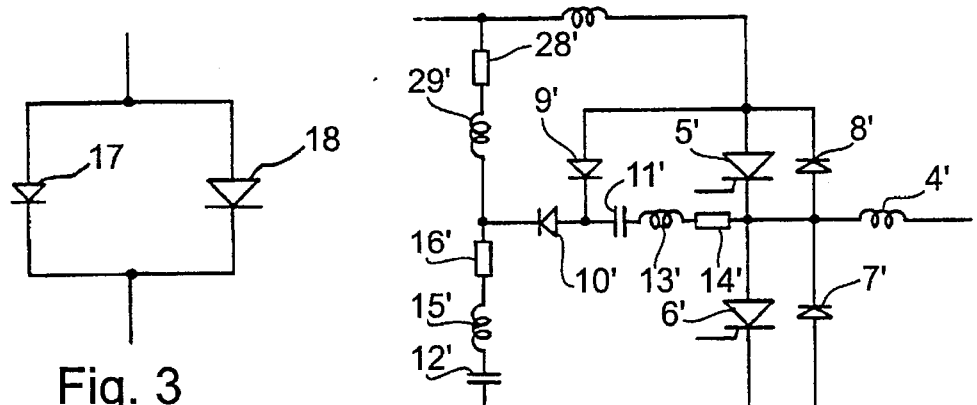
Fig. 3
Fig. 2
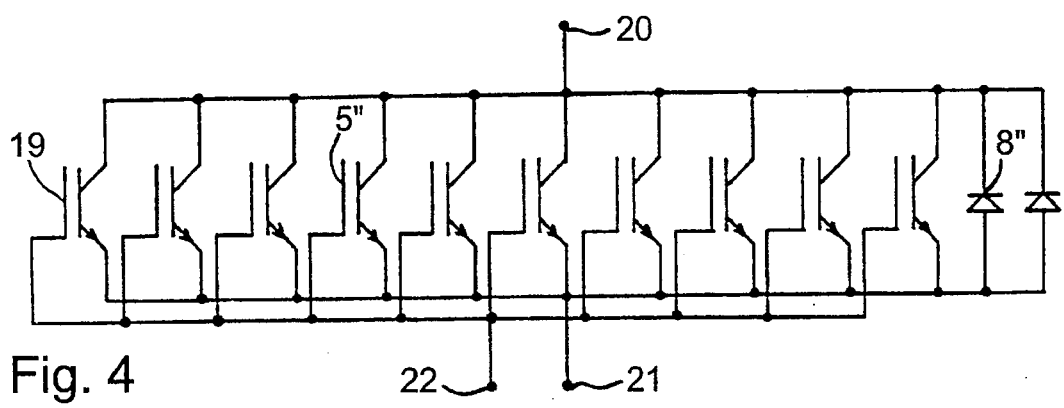
Fig. 4
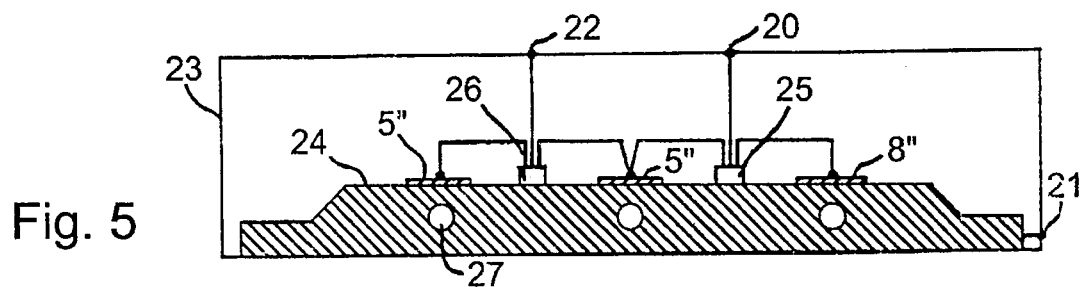
Fig. 5

CONVERTER CIRCUIT, CIRCUITRY HAVING AT LEAST ONE SWITCHING DEVICE AND CIRCUIT MODULE

TECHNICAL FIELD AND BACKGROUND OF THE INVENTION

The present invention relates to a converter circuit having at least one switching device and a diode arranged to be conducting when the device is turned off, and reverse biased when the device is turned on, as well as circuitry and a module according to the independent claims herein.

The invention is particularly, but not exclusively, concerned with the problems arising in converter circuits used for high voltage applications, and it is directed to all types of such converter circuits, such as inverters converting a direct-current voltage to an alternating voltage, rectifiers converting an alternating voltage into a direct-current voltage, and direct current converters converting a direct-current voltage into a higher or lower direct-current voltage.

Such converter circuits are connected to a load, for instance an electric motor, which is supplied with a certain voltage obtained by the converter circuit. A diode in this circuit is used as a so-called freewheeling diode to improve the capability of the converter circuit to produce a voltage with characteristics aimed at primarily smoothing out abrupt changes in the circuit due to switchings of the switching device, and to protect the latter by taking care of the conduction of the current which the load calls for when the switching device is turned off.

Prior art diodes in such converter circuits, and mostly made of Si, have some disadvantages which cause severe problems. In fact, these diodes are the devices which tend to limit the performance of the entire circuit, mainly because of the inherent limitations in switching performance with large switching losses and risk of destruction due to dynamic avalanche. At higher voltages, diffused pn-junction diodes, having high switching losses, are used.

The main problem arises when the switching device of the circuit is turned on, and the diode becomes reverse biased. The diodes of this type have a relatively high reverse recovery charge, i.e. a high amount of excess electrons and holes are stored within the n- and p-regions of the device, and this charge has to be withdrawn when the diode is reverse since a reverse current, appreciably higher than the saturation or leakage current in the turned-off state of the diode, will continue to pass therethrough for some time. This results in high switching losses and heat dissipation in the diode, since the voltage over the diode during this reverse current will be high after the turning on of the switching device and also the turning off of the diode. Also, this reverse current through the diode causes extra turn-on losses within the switching device. Furthermore, the diodes of Si become unstable even at comparatively low temperatures.

The quality of the current obtained by such a converter circuit will increase with increasing frequency of the switching of the switching device, but the switching losses also increase with increased switching frequency, so that the frequency of the switching has to be kept at such a low level in order that the devices of the converter circuit will not be destroyed due to overheating.

Furthermore, the diode may be destroyed due to dynamic avalanche when there are excess charge carriers left in the diode when the reverse blocking voltage over the diode has become high. Thus, there usually is a need to reduce the turn-on speed of the switching device, which is not desirable for optimal performance of the circuit.

There is a further problem, although mostly not that accentuated, when the switching device is turned off. The diode will then be turned on with a very fast increasing current. The large Si diodes used as high-voltage power devices will, namely directly after turning on of the diode before the creation of a required amount of excess charge carriers therein, have a high resistance resulting in a high voltage, a phenomena called forward recovery. This voltage overshoot can have negative effects on the power electronic circuit, creating unwanted losses. It can also stress the diode and limit the lifetime of the diode thereby influencing the reliability of the entire converter circuit. This also causes voltage overshoots for the switching device. When the diode, is used as a snubber diode this forward recovery overshoot is often the limiting factor for the switching devices, especially if it is a GTO.

SUMMARY OF THE INVENTION

The object of the present invention is to provide a converter circuit of the type defined in the introduction, in which the disadvantages mentioned above are drastically reduced with respect to such converter circuits already known. This object is, in accordance with the invention, obtained by making said diode of SiC.

SiC has it high thermal stability due to a large band-gap energy, so that devices fabricated from SiC are able to operate at high temperatures, namely up to 1000 K. Furthermore, it has a high thermal conductivity, so that SiC devices may be made having a high density.

SiC also has an approximately ten times higher breakdown field than Si, so that it is well suited as a material for high power devices operating under conditions where high voltages may occur in the blocking state of a device. A diode in a converter circuit in accordance with the invention, having to hold a certain voltage in its blocking state may be made much thinner than a corresponding diode of Si. As a result, when the switching device in the converter circuit according to the invention is turned on, there will, in the case of a pn- or pin-diode, be a very low-reverse recovery charge in the diode resulting in a short reverse recovery time and much lower switching losses in the diode compared with diodes of Si.

If the diode of SiC is, by itself arranged to accommodate substantially all the current to, be led to or from, the load connected to the circuit, not only are the switching losses in the diode drastically reduced, but also the heat energy generation in the switching device, upon its being turned; on thereof will be lower because of the reduced recovery current through the diode, which is led through the switching device and added to the turn-on current therethrough. Accordingly, less heat is generated in the circuit in the form of switching losses, with the result that the components will be less exposed to stresses at a given switching frequency, so that it is possible to benefit from this advantage and keep the frequency just as high as in the prior art devices, or even higher and thereby enhancing operating performance of circuit. Furthermore, the much lower reverse recovery charge in the diode will considerably raise the margins to dynamic avalanche therein.

When the switching device in a converter circuit according to the invention is turned off, the SiC diode, being much thinner than the Si diode, will in the case of a pn- or pin-diode, turn on rapidly without any voltage peak, i.e. it has a much lower forward recovery. This results in fewer disturbances in the power electronic circuit, as well as lower power losses, at turn-on of the diode.

The inventive concept of using SiC as the material for a diode according to the introduction hereof also makes a type of diode hitherto excluded for high voltage use, but now very advantageous for solving the problems discussed in the introduction available for this type of converter circuits, namely the Schottky diode. Prior art Schottky diodes mostly made of Si were never a realistic option as diodes in converter circuits for the following reasons. They may not hold higher than one or two hundred volts in the reverse blocking state before reverse leakage becomes a problem. Increasing the breakdown voltage of such a Schottky diode by making the low-doped region adjacent to the metal very thick will, in the forward conducting state, cause high losses since a Schottky diode functions as a majority carrier conductor and the low-doped region will function as a resistor. However, SiC has, as mentioned above, an approximately ten times higher breakdown field than Si, so that a Schottky diode of SiC may be made much thinner and may still hold voltages in the KV-range in the reverse blocking state. This, in combination with the material dependent possibility to have a higher doping in SiC than in Si reduces the resistance of such a diode in the forward conducting state to a readily acceptable level. Thus, it will be possible to benefit from the other characteristics of a Schottky diode making it well suited for this use in converter circuits, namely that there are, due to primarily majority carrier conduction, no instances of real reverse recovery behaviour on turning off nor forward voltage overshoot on turning on. Thus, the inventive concepts disclosed herein are applicable also to Schottky diodes made of SiC when reference is made to diodes of SiC.

According to a preferred embodiment of the invention, the SiC diode is so arranged that upon turning said switching device off, it can accommodate substantially all the current to be conducted to or from a load connected to the circuit and fed through the switching device in its turned-on state. In this case, no other diode is required for accommodating substantial portions of the current led through the switching device in its turned-on state, so that the disadvantages discussed above in the prior art converter circuit will not arise, and it will be possible to fully benefit from the advantages of providing a diode of SiC in accordance with the invention.

According to another preferred embodiment of the invention, the circuit is an inverter circuit having a second diode of SiC connected antiparallel to the first mentioned switching device and a second switching device connected anti-parallel to the first mentioned diode, and also one of a) the first switching device and the first diode and b) the second switching device and the second diode are arranged to take care of the supply of current to and the other from the load. By using the two diodes of SiC in such an inverter circuit, is possible to invert the direct-current voltage to an alternating voltage while obtaining improved circuit performances according to the discussion above.

According to a further preferred embodiment of the invention, the switching device is a gate turn-off thyristor, and the SiC diode is a snubber diode arranged in a branch connected in parallel with the switching device and also including a capacitor connected in series with the diode and arranged to be charged when the switching device is turned off and discharged when the switching device is turned on. It is essential that the snubber diode starts to conduct the current immediately upon turning off the thyristor for protecting the thyristor against destruction, and this is possible as a result of the that the diode of SiC may be made much thinner than a corresponding diode of Si. Furthermore, it is possible that the thyristor is turned on again before the current and the charge carriers have completely disappeared from the snubber diode, with the result that it will be reverse biased and the same reverse recovery problem with high switching losses and a risk of dynamic avalange would arise were the diode made of Si instead of SiC.

The invention also comprises circuitry having at least one switching device and a first diode arranged to be forward biased and conducting when the device switches in one direction. This circuitry has a second diode of SiC connected in parallel with the first diode and designed to instantaneously, upon the switching, accommodate the major portion of the current through the two diodes, the portion decreasing with time and being in the steady conducting state a minor portion of the current conducted through the two diodes. As a result of the arrangement of the SiC diode in parallel with the first diode, the problems resulting from negative effects in the lower electronic circuit, unwanted losses and stresses excerted on the first diode, and the resulting limitation of the lifetime thereof, will be solved. The diode of SiC may be made much thinner than the first diode if this is made of silicon, so that it will turn on much faster with a very small forward recovery voltage and the voltage overshoot over the first diode will be considerably reduced, thus solving the problems last mentioned. When the circuitry is in the steady conducting state, the major portion of the current will be conducted through the first diode, so that the second diode of SiC may be made with a very small area. Such a small area of the second diode will nevertheless be able to reduce significantly the voltage overshoot at turn-on, since the specific differential resistance at turn on of a SiC power diode will be much lower than in the corresponding Si diode.

The invention also comprises a device module comprising several switching devices, and at least one diode of SiC arranged in a closed casing having terminals for connection thereof to an electric circuit. A diode of SiC used in a device module will, owing to the characteristics of SiC, give rise to lower heat dissipation of the devices as compared to the situation where the diode is made of silicon, making it possible to have a simpler cooling arrangement and also to arrange the devices at a higher density within the module.

According to a preferred embodiment of the invention, such a module is designed to be arranged in a converter circuit, with switching devices connected in parallel and at least one SiC diode connected antiparallel to the switching devices, and with the gates of the switching devices being connected in groups. Such a module will be advantageously used as a part of a converter circuit, where each switching device will accommodate a portion of the current to be conducted to or from the load, and the SiC diodes may be used for solving the problems arising when the switching devices are turned on and off in the way discussed above. As a result of the use of diodes of SiC, such a module may have lower losses and heat dissipation than if the diode were made of silicon so that it is possible to make it very compact without any risk of overheating and damaging its components.

Further preferred features and advantages of the invention will appear from the other dependent claims and the following description.

BRIEF DESCRIPTION OF THE DRAWINGS

With reference to the appended drawing, below follows a specific description of preferred embodiments of the invention cited as examples.

In the drawings:

FIG. 1 is a circuit diagram of a converter circuit according to a first preferred embodiment of the invention, FIG. 2 is a circuit diagram of a converter circuit according to a second preferred embodiment of the invention, FIG. 3 illustrates a third preferred embodiment of the invention, FIG. 4 is a circuit diagram of a part of a converter circuit according to a fourth preferred embodiment of the invention, and FIG. 5 is a schematic, partially sectioned view of a module according to a preferred embodiment of the invention constructed in accordance with FIG. 4.

DETAILED DESCRIPTION OF PREFERRED EMBODIMENTS OF THE INVENTION

Figure 6:
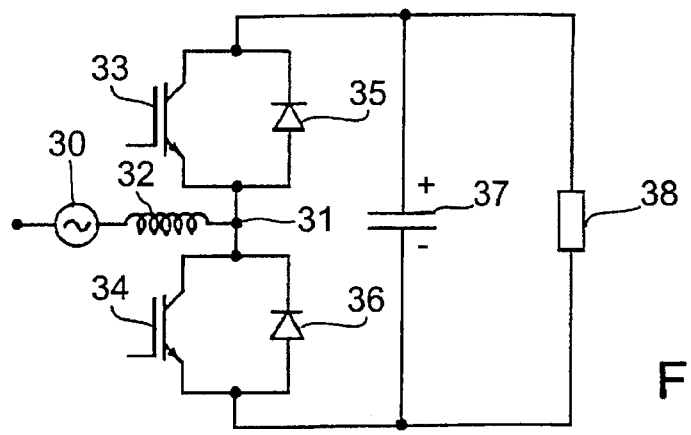
FIG. 6 is an embodiment of the convertor circuit comprised of an AC-DC rectifier.

A circuit diagram of a converter circuit in the form of an inverter circuit according to a preferred embodiment of the invention is shown in FIG. 1. More exactly, the circuit shown in FIG. 1 is arranged to drive one phase, i.e. constitute one leg, of a three-phase power supply to a load. The circuit comprises a direct-current voltage power supply 1 with a positive and a negative electrode 2 and 3, respectively. The direct-current voltage from the power supply 1 has to be inverted to an alternating voltage by the inverter circuit for driving one phase of a load 4 here indicated by an inductance.

The circuit comprises a first switching device 5 here indicated by an IGBT, i.e. an Insulated Gate Bipolar Transistor, a second switching device 6 in the form of another IGBT connected in series therewith, a first diode 7 of SiC connected in series with the first switching device 5 and anti-parallel to the second switching device 6 as well as a second diode 8 of SiC connected in series with the parallel connection of the first diode 7 and the second switching device 6 and anti-parallel to the first switching device 5. The IGBTs may be replaced by other BiMOS switching devices, e.g. MOS Controlled Thyristors (MCT). The two diodes 7 and 8 are in this case high voltage power diodes with the function as so called free wheeling diodes.

The function of the inverter circuit is as follows: During the first positive half of a period of the alternating voltage created by the circuit for the load 4, the first switching device 5 is turned on and off with high frequency. When the switching device 5 is in the conducting state, the voltage drop thereover is low and the main part of the voltage drop of the power supply will be over the second diode 7, thus being in the reverse blocking state. The voltages over the IGBT 5 and the diode 7 may, for instance, be a few volts and one or a few kV, respectively.

The current from the IGBT 5 is led to the load 4. When the IGBT 5 is turned off, the load 4 calls for the same current as before because of the inductance of the load and the diode 7 will be turned on with the same dI/dt as for the turning off of the IGBT 5. To keep the switching losses low, it is desired to obtain a rapid turn-off of the IGBT, which accordingly will result in a rapid current increase through the diode 7.

Since the diode 7 is made of SiC it may be thin and still have a high breakdown field. Thus, the diode 7 will be turned on rapidly without any voltage peak, so that there will be no disturbances in the circuit and the losses therein will be very small. The current to the load 4 will, when the IGBT 5 is completely turned off, be supplied through the diode 7. When the IGBT 5 is turned on again, the diode 7 will be turned off with the same dI/dt as the IGBT 5 is turned on. When the IGBT 5 has been completely turned on, the voltage thereacross will be low and the main voltage, i.e. one or a few kV will reverse bias the diode 7 with a voltage thus being high.

The reverse recovery charge in the form of excess electrons and holes present in the diode 7 will be led through the diode in the reverse direction thereof, creating a switching loss in the diode as well as increasing the turn-on switching loss in the IGBT 5, since this current is added to the very turn-on current through the IGBT 5. However, these losses are in the present case very low, since the SiC diode will have a very low reverse recovery charge in comparison with, for instance, corresponding Si diodes. Thus, the losses in the diode 7 as well as in the IGBT 5 will be drastically reduced. Accordingly, switching may be carried out at a higher frequency without any higher losses than when using a Si diode and thus the performance of the circuit be improved. The switching of the IGBT 5 during said half period will take place many times in small time increments of the half-period. For creating the second negative half period of the alternating voltage supply to the load 4, the second IGBT 6 is turned on and off resulting in that the current is drawn from the load 4 to the IGBT 6 and the second diode 8 alternatingly. The behaviour of the second IGBT 6 and the second diode 8 will be the same upon turning on and off as discussed above for the first IGBT 5 and the first diode 7.

The circuit diagram of FIG. 2 illustrates an inverter circuit according to a second preferred embodiment of the invention with a load 4', a first switching device 5' in the form of a GTO, i. e a Gate Turn-Off Thyristor, a first free-wheeling diode 7' which may be of Si, SiC or another suitable material, a second switching device 6' in the form of a GTO and a second free wheeling diode 8', which may be of Si, SiC or other suitable material. This circuit is arranged to invert a direct-current voltage in the same way as the circuit according to FIG. 1 with the diodes 7' and 8' functioning in the same way upon turning on and off of the GTOs 5' and 6'. This circuit also comprises a so called snubber diode 9' and 10' made of SiC connected in parallel with the GTO 5' and 6', respectively. Each snubber diode is connected in series with a capacitor 11', 12'. A branch connected parallel to each GTO also comprises a parasitic stray inductance and a resistor 13', 14' and 15', 16', respectively. The circuit also comprises a resistor 28' and a stray inductance 29'.

The function of the snubber diode branch connected in parallel with each GTO is as follows: when the first GTO 5' is turned off the voltage thereacross starts to increase, and it would, in absence of the snubber diode, increase to a comparatively high level when the current therethrough is still high, so that the power losses will be comparatively high. The arrangement of the snubber diode 9' and the capacitor 11' will lead to a lower dU/dt over the GTO 5' upon turning off said GTO, so that the snubber diode is turned on and the capacitor 11' is charged when the voltage is increasing over the GTO 5.

After the turning off state of the GTO 5', the first diode 7' will be turned on and lead the current to the load 4' and the current through the snubber diode 9' will be negligible. When the GTO 5' is turned on again, the capacitor 11' will be discharged comparatively slowly through the diode 10' and the resistor 28' and stray inductance 29', so that it will preferably be empty and ready to be charged again when the GTO 5' is turned off the next time. It is essential for protecting the GTO upon its being turned off, that the snubber diode 9' is turned on rapidly, and this is ensured by making the diode of SiC. It may also happen that the GTO 5' is turned on before all the excess charge carriers and all the current has "disappeared" in the snubber diode 9', which means that there will be a reverse recovery current through the snubber diode 9' when the GTO 5' is turned on, but the switching losses resulting therefrom will be very low when the snubber diode is made of SiC.

FIG. 3 shows a parallel connection of two diodes, namely a first small SiC diode 17 and a large diode 18 of Si. According to an embodiment of the invention, any of the diodes 7, 8, 7', 8' and the snubber diode 9' may be exchanged for the parallel connection shown in FIG. 3. When the corresponding switching device is turned off, this will mean that the small SiC diode will, due to the low thickness and short charge carrier life time thereof and low forward recovery, accommodate a major portion of the current through the two diodes instantaneously upon turning off the switching device, so that there will be substantially no voltage overshoot over the diodes 17 and 18. The portion of the current led through the diode 17 will decrease with time and turn into a minor portion of the current led through the two diodes during the turn off state of the switching device. Accordingly, after a while, almost all the current is led through the larger Si diode 18 having a much higher amount of charge carriers. Thus, the parallel connection according to FIG. 3 makes it possible to use a Si diode 18 for conduction when a switching device is turned off without any negative effect upon the power electronic circuit of a high forward recovery thereof. The use of such an arrangement is best suited for applications where the forward recovery is critical but not the reverse recovery, because the large silicon diode 18 will cause a large reverse recovery when turning off. Such applications may specifically be in the form of snubber diodes.

FIG. 4 illustrates a module according to the invention which comprises a parallel connection of ten switching devices 5" and two diodes 8" of SiC. This module has the same function as the parallel connection of the first switching device 5 and the second diode 8 in FIG. 1. The gates 19 of the switching devices are interconnected and intended to be actuated simultaneously. The switching devices 5" are intended to conduct equal parts, for instance 50A, of the total current of the module, in that case 500A, to be supplied to a load, while the two diodes 8" are intended to have the same function as the second diode 8 in FIG. 1 and together conduct the current through the load when the switching devices of a similar module, not shown and connected to this module, are turned off. A first terminal 20 of the module is intended to be connected to a terminal of a power supply, a second terminal 21 of the module is intended to be connected to the switching devices, and diodes of a similar module at the side thereof not connected to the other terminal of the power supply and a third terminal 22 is provided for simultaneously turning the switching devices 5" on and off.

It is illustrated in FIG. 5 how the diodes and switching devices are arranged in a closed casing 23. The back of each device chip 5" and 8" is soldered to a conducting plate 24 and, by that, interconnected. The opposite side of the switching devices 5" and the diodes 8" are interconnected through conducting strips or bonding wires to a conducting bar 25, wherein the strips from the left side row of the switching devices in FIG. 5 to said bar 25 are not shown in the Figure. Furthermore, there is a second conduction bar 26 to which the gates of all the switching devices are connected. The terminals 20, 21 and 22 are indicated in FIG. 5. The chips 5" and 8" are preferably arranged in three rows with four in each row, so that the right hand row in FIG. 5 will have two diodes 8" and two switching devices 5". The conduction plate 24 has cooling channels 27 for cooling the semiconductor devices of the module, by a medium (liquid or gaseous) flowing therethrough. Because of the fact that the diodes 8" are made of SiC, switching losses created in the module will be much lower than in prior art circuits of the same type, so that it will be possible to arrange the devices at a high density without any risk of overheating. Although a module constituting half the so-called phase leg is described above and illustrated in the figures, the invention also comprises alternative device modules of this type. For instance, in one embodiment the entire phase leg in FIG. 1, i.e. all the components 5, 8 and 6,7, may be included in the module, which then will consist of the two sets of the kind shown in FIG. 4. It would also be possible to construct the device module to comprise all three phases of the converter including six such sets or packs.

The invention is of course not in any way restricted to the preferred embodiments described above, but several modifications thereof will be apparent to a man with ordinary skill in the art without departing from the basic idea of the invention.

Although a converter circuit in the form of an inverter circuit has been shown in the figures, the converter circuit of the invention may just as well be a rectifier or a DC-DC-converter circuit. Furthermore, such circuits may have the most different configurations, and the converter circuits shown in the FIGS. 1–5 are only some of a very large number of possible converter circuits known in this field and within the scope of the invention.

FIGS. 6–9 show alternative embodiments of the invention already disclosed and described above. More specifically, FIG. 6 is a circuit diagram of a converter circuit according to a preferred embodiment of the invention in the form of an inverter circuit adapted to convert an alternating-current voltage to a direct-current voltage. The circuit is connected to an alternating-current voltage power supply 30 and the power supply 30 is connected to a mid-point 31 of one of three parallel branches through an inductance 32. A switching device 33, 34 is connected anti-parallel to a SiC diode 35, 36, on opposite sides of the mid-point 31 in the branch belonging thereto. A capacitor 37 and a resistor 38 are connected in parallel with the branch. By alternatingly turning the switching devices 33 and 34 on and off, the alternating-current voltage from the power supply 30 will be converted into a direct-current voltage over the capacitor 37. High switching frequencies may be used due to small reverse recovery charge of the SiC diodes 35, 36.

Figure 7:
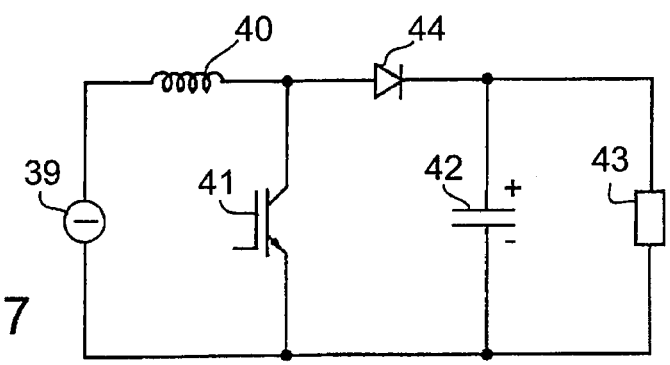
FIG. 7 is an embodiment of the convertor circuit comprised of an DC-DC convertor.

FIG. 7 is a circuit diagram of a device for converting a direct-current voltage to a direct-current voltage of a greater magnitude, a so called step-up direct-current converter. This converter circuit comprises a direct-current voltage power supply 39 connected in series with an inductor 40. A switching device 41, a capacitor 42 and a resistor 43 are connected in parallel with the power supply 39. Furthermore, a SiC diode 44 is connected between the switching device 41 and the capacitor 42. By turning the switching device 41 on and off, the direct-current voltage of the power supply 39 will be converted to a direct-current voltage of a higher magnitude over the capacitor 42. The heat dissipation in the diode 44 will be low because it is made of SiC.

Figure 8:
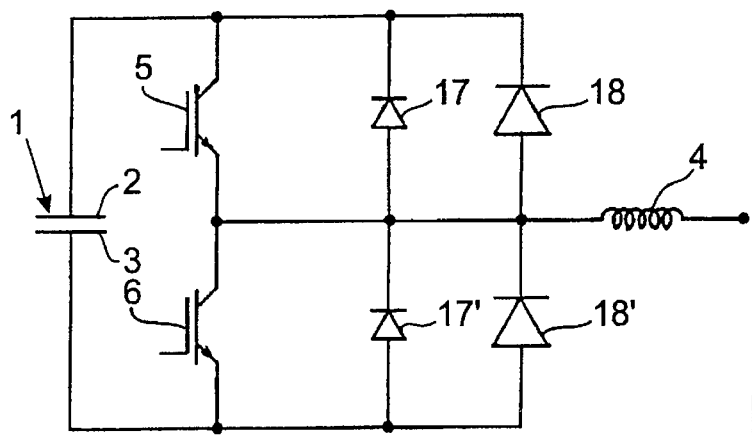
FIG. 8 is another embodiment of the convertor circuit shown in FIG. 1.

FIG. 8 is a circuit diagram of a converter circuit corresponding to that shown in FIG. 1, the only exception being that the diodes 7 and 8 are replaced by a SiC small diode 17, a larger diode 18, a SiC small diode 17', and a larger diode 18', respectively. The general function of this converter circuit is the same as that for the circuit according to FIG. 1 except for the fact that the SiC diode 17, 17' will instantaneously, upon turning off the respective switching device 5, 6, accommodate a major portion of the current through the two diodes 17, 18 and 17', 18', respectively, wherein the portion decreases with time and turns into a minor portion of the current led through the two diodes in question during the turn-off state of the switching device. This means that there will be substantially no voltage overshoot over the diodes 17 and 18 or 17' and 18' upon turning off the switching device. The larger diodes are advantageously made of Si.

Figure 9:
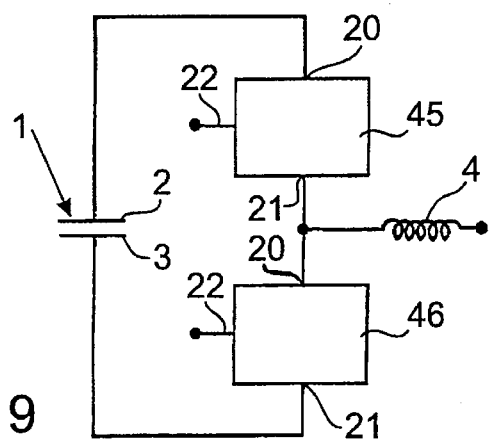
FIG. 9 is a circuit diagram illustrating another embodiment of FIG. 1 including the modules of FIG. 4.

FIG. 9 is a circuit diagram illustrating how two modules according to FIG. 4 will be connected to each other for forming the converter circuit of the type shown in FIG. 1. The reference numerals of FIGS. 1 and 4 have been inserted in this figure for clarifying how the modules are connected to each other, namely a first terminal 20 of the first module 45 is connected the negative electrode 2 of the power supply 1, and a second terminal 21 of this module 45 is connected to a corresponding first terminal 20 of a second module 46, the second terminal 21 of which is connected to the positive electrode 3 of the power supply 1.

We claim:

1. A converter circuit having at least one switching device and a diode arranged to be conducting when the switching device is turned off and reverse biased when the switching device is turned on, and wherein the diode is made of SiC.

2. A circuit according to claim 1, wherein said diode is a Schottky diode.

3. A circuit according to claim 1, wherein said diode is arranged to, upon turning said switching device off, alone accommodate substantially all the current to be conducted to and from a load connected to the circuit and fed through said switching device in the turned on state thereof.

4. A circuit according to claim 1, wherein said switching device is made of a material being conventional within the semiconductor field.

5. A circuit according to claim 1, wherein said switching device is one of a) an Insulated Gate Bipolar Transistor (IGBT), and b) another BiMOS switching device.

6. A circuit according to claim 1, wherein said switching device is a GTO, a Gate Turn-Off (GTO) thyristor.

7. A circuit according to claim 1, wherein it is an inverter (DC→AC) circuit.

8. A circuit according to claim 1, wherein said circuit is a rectifier (AC→DC) circuit.

9. A circuit according to claim 1, wherein said circuit is a (DC→DC) converter circuit.

10. A circuit according to claim 1, wherein said diode is connected in series with said switching device, and wherein a common point at the connection of said switching device and said diode is connected to a load to be driven by the voltage converted by said circuit.

11. A circuit according to claim 10, wherein said switching device and said diode are each connected to a terminal of a power supply, the voltage of which is to be converted by the circuit.

12. A circuit according to claim 7, wherein said circuit further comprises a second diode of SiC connected anti-parallel to said first mentioned switching device (5,5') and a second switching device connected anti-parallel to the first mentioned diode, and wherein one of a) said first switching device and said first diode and b) said second switching device and said second diode accommodates the supply of current to said load, and the other from said load.

13. A circuit according to claim 12, wherein said two switching devices and said two diodes drive one phase of a three-phase current supply to a load.

14. A circuit according to claim 1, wherein the switching device is a Gate Turn-Off thyristor (GTO), and wherein said SiC-diode is a snubber diode arranged in a branch connected in parallel with said switching device and also including a capacitor connected in series with the snubber diode and arranged to be charged when the switching device is turned off and discharged when the switching device is turned on.

15. A circuit according to claim 1, wherein said circuit further comprises a second larger diode connected in parallel with said SiC-diode, and wherein said SiC-diode is designed to instantaneously upon turning off the switching device, accommodate a major portion of the current through the two diodes, said portion decreasing with time and turning into a minor portion of the current led through the two diodes during the turn-off state of the switching device.

16. A circuit according to claim 15, wherein the larger diode is made of Si.

17. A circuitry having at least one switching device and a first diode arranged to be forward biased and conducting when the device switches in one direction, and wherein a second diode of SiC is connected in parallel with said first diode and designed to instantaneously upon said switching accommodate a major portion of the current through the two diodes, said portion decreasing with time and being in the steady conducting state a minor portion of the current led through the two diodes.

18. A circuitry according to claim 17, wherein the first diode is made of Si.

19. A device module comprising several switching devices and at least one diode of SiC arranged in a closed casing having terminals for connection thereof to an electric circuit.

20. A module according to claim 19, wherein said module is arranged in a converter circuit, and has switching devices connected in parallel and at least one SiC diode connected anti-parallel to the switching devices, and wherein the gates of the switching devices are connected in groups.

21. A module according to claim 20, wherein said module comprises means for connection thereof to a substantially identical module with one side of the switching devices and diodes of the module connected to the opposite side of the switching devices and diodes of the other module, and wherein a terminal of each module connected to the switching devices and diodes of the module at the side not connected to the other module, is arranged to be connected to one terminal each of a power supply, the voltage of which is to be converted by the circuit.

* * * * *